(12) United States Patent
Tominaga (10) Patent No.: US 11,194,202 B2
(45) Date of Patent: Dec. 7, 2021

(54) SUBSTRATE FOR DISPLAY DEVICE, AND DISPLAY DEVICE

(71) Applicant: Sharp Kabushiki Kaisha, Osaka (JP)

(72) Inventor: Masakatsu Tominaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 31 days.

(21) Appl. No.: 16/750,102

(22) Filed: Jan. 23, 2020

(65) Prior Publication Data

US 2020/0241371 A1    Jul. 30, 2020

Related U.S. Application Data

(60) Provisional application No. 62/797,464, filed on Jan. 28, 2019.

(51) Int. Cl.

| | |
|---|---|
| *G02F 1/1362* | (2006.01) |
| *G02F 1/1368* | (2006.01) |
| *H01L 27/12* | (2006.01) |
| *G02F 1/1335* | (2006.01) |
| *G02F 1/1343* | (2006.01) |

(52) U.S. Cl.
CPC ...... *G02F 1/136286* (2013.01); *G02F 1/1368* (2013.01); *G02F 1/133514* (2013.01); *G02F 1/134309* (2013.01); *G02F 1/136213* (2013.01); *H01L 27/124* (2013.01)

(58) Field of Classification Search
CPC .................... G02F 1/13624; G02F 1/136213
See application file for complete search history.

(56) References Cited

U.S. PATENT DOCUMENTS

| | | | | |
|---|---|---|---|---|
| 5,337,173 | A | * 8/1994 | Atsumi | ............ G02F 1/136213 349/39 |
| 2012/0112200 | A1 | 5/2012 | Nagano | |

FOREIGN PATENT DOCUMENTS

| | | |
|---|---|---|
| JP | 10-142578 A | 5/1998 |
| JP | 2012-103343 A | 5/2012 |

* cited by examiner

*Primary Examiner* — James A Dudek
(74) *Attorney, Agent, or Firm* — Keating & Bennett, LLP (57) ABSTRACT

A substrate for a display device includes image lines arranged in a first direction, scanning lines arranged in a second direction intersecting the first direction, pixel electrodes arranged in the first direction and the second direction, a first switching element, and a second switching element. Each of the pixel electrodes has an elongated shape extending in the first direction. The first switching element is connected to one of two scanning lines sandwiching the pixel electrodes, one of the pixel electrodes located at an even-numbered position from an end in the first direction, and one of the image lines adjacent to the even-numbered pixel electrode. The second switching element is connected to the other scanning line, one of the pixel electrodes located at an odd-numbered position from the end in the first direction, and one of the image lines adjacent to the odd-numbered pixel electrode.

11 Claims, 9 Drawing Sheets

SUBSTRATE FOR DISPLAY DEVICE, AND DISPLAY DEVICE

CROSS REFERENCE TO RELATED APPLICATION

This application claims priority from U.S. Provisional Patent Application No. 62/797,464 filed on Jan. 28, 2019. The entire contents of the priority application are incorporated herein by reference.

TECHNICAL FIELD

The technology described herein relates to a substrate for a display device, and a display device.

BACKGROUND

Known examples of liquid crystal display devices are described in Japanese Unexamined Patent Application Publication No. H10-142578 and Japanese Unexamined Patent Application Publication No. 2012-103343. In the liquid crystal display device, date lines Dj−2, Dj, . . . are provided for corresponding pixel groups each including two columns of pixels PX(i, j) (i=1~m, j=1~n) to apply a signal voltage to the pixel group. One first gate line GAi and one second gate line GBi are provided for each of the rows of the pixels. The first gate line GAi applies a gate voltage to n/2 pixels among n pixels in the $i^{th}$ row to which a signal voltage is applied through n/2 data lines. The second gate line GBi applies a gate voltage to n/2 pixels among n pixels in the $i^{th}$ row other than the pixels to which a gate voltage is applied through the first gate line GAi. The liquid crystal display panel of the liquid crystal display device has a contact hole for connection between the common electrode and the common signal line in each of boundary areas between two adjacent pixels where no signal line is disposed, and the contact hole is shared by the two adjacent pixels. The boundary areas overlap the black matrix of the counter substrate.

The liquid crystal display devices require a smaller number of data lines (signal lines) to drive the pixels. Japanese Unexamined Patent Application Publication No. H10-142578 does not disclose the specific configuration of the pixel electrodes of the pixels. Japanese Unexamined Patent Application Publication No. 2012-103343 discloses that the pixel electrodes have long sides extending in the direction in which the scanning lines extend and short sides extending in the direction in which the signal lines extend. The pixel electrodes adjacent to each other in the direction in which the scanning lines extend are charged at different timings, and thus large parasitic capacitance may be generated between the pixel electrodes charged first and the pixel electrodes charged second. If the potential of the charged pixel electrode is fluctuated by the parasitic capacitance, the display tone deviation would occur, lowering the display quality.

SUMMARY

The technology described herein was made in view of the above-described circumstances, and an object thereof is to reduce the potential fluctuation in the pixel electrode.

A substrate for a display device includes image lines arranged at intervals in a first direction, scanning lines arranged at intervals in a second direction intersecting the first direction, pixel electrodes arranged at intervals in the first direction and the second direction in rows and columns and each having an elongated shape extending in the first direction, a first switching element connected to one of two scanning lines sandwiching the pixel electrodes, one of the pixel electrodes that is located at an even-numbered position from an end in the first direction, and one of the image lines adjacent to the even-numbered pixel electrode, and a second switching element connected to the other of the two scanning lines sandwiching the pixel electrodes, one of the pixel electrodes that is located at an odd-numbered position from the end in the first direction, and one of the image lines adjacent to the odd-numbered pixel electrode.

According to the technology described herein, the potential fluctuation in the pixel electrode is reduced.

DETAILED DESCRIPTION

First Embodiment

A first embodiment of the invention is described with reference to FIGS. 1 to 6. In this embodiment, a liquid crystal display device (display device) 10 is described. The X axis, the Y axis, and the Z axis are indicated in some of the drawings, and each of the axes indicates the same direction in the respective drawings. The upper side in FIG. 5 corresponds to the front side, and the lower side in FIG. 5 corresponds to the rear side.

Figure 1:
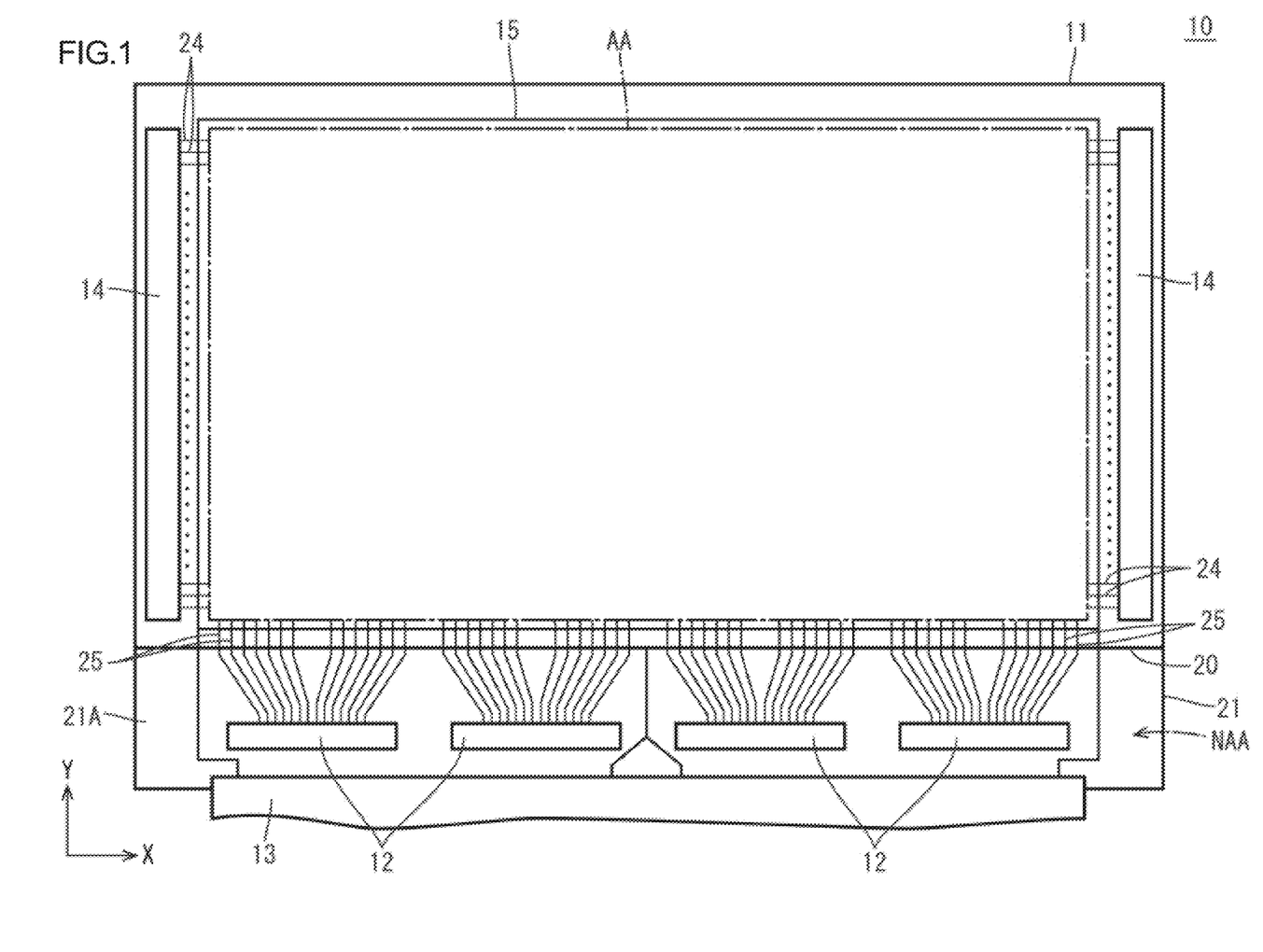
FIG. 1 is a plan view schematically illustrating a liquid crystal panel included in a liquid crystal display device according to a first embodiment of the invention.

FIG. 1 is a plan view schematically illustrating the liquid crystal panel 11. As illustrated in FIG. 1, the liquid crystal display device 10 includes at least a liquid crystal panel (display device, display panel) 11 capable of displaying an image and a backlight device (lighting device) that applies display light to the liquid crystal panel 11. The backlight device is positioned behind (on the rear side of) the liquid crystal panel 11. The backlight device includes a light source (for example, an LED) that emits white-colored light (white light) and an optical member that exerts an optical effect on the light from the light source to convert the light into planar light.

As illustrated in FIG. 1, the liquid crystal panel 11 has a horizontally long rectangular shape in a plan view. The middle of the screen of the liquid crystal panel 11 is a display area (surrounded by a one-dot chain line in FIG. 1) AA on which an image is displayed. The frame-shaped outer periphery of the screen of the liquid crystal panel 11 surrounding the display area AA is a non-display area NAA on which no image is displayed. The liquid crystal panel 11 includes two substrates 20 and 21 attached to each other and a liquid crystal layer interposed between the substrates 20 and 21. One of the substrates 20 and 21 on the front side (front surface side) is a CF substrate (counter substrate) 20 and the other on the rear side (rear surface side) is an array substrate (substrate for a display device, active matrix substrate) 21. The CF substrate 20 and the array substrate 21 each include a glass substrate and various films laminated on the inner surface of the glass substrate. The substrates 20 and 21 each have a polarizing plate on the outer surface. Furthermore, the substrates 20 and 21 each have an alignment film for aligning the liquid crystal molecules contained in the liquid crystal layer on the innermost surface adjacent to the liquid crystal layer.

As illustrated in FIG. 1, the CF substrate 20 has shorter short sides than the array substrate 21. The CF substrate 20 and the array substrate 21 are attached to each other with ends at one of the ends in the short-side direction (Y axis direction) being put together. Thus, the array substrate 21 has a CF substrate non-overlapping portion 21A protruding horizontally from the CF substrate 20 and not overlapping the CF substrate 20 at the other end in the short-side direction. Drivers (driving circuits) 12 for supplying signals and a flexible board (signal transmission member) 13 are mounted on the CF substrate non-overlapping portion 21A. The driver 12 includes an LSI chip having a driving circuit therein and is mounted on the CF substrate non-overlapping portion 21A by using Chip On Glass (COG) technology. The drivers 12 process various signals from the flexible board 13. In this embodiment, four drivers 12 are disposed on the CF substrate non-overlapping portion 21A with a space therebetween in the X axis direction. The flexible board 13 includes a base member formed of a synthetic resin material having insulating properties and flexibility (for example, a polyimide resin) and has multiple wiring patterns on the base member. The flexible board 13 is connected to the CF substrate non-overlapping portion 21A at one end and connected to a control board (signal source) at the other end. The various signals from the control board are sent to the liquid crystal panel 11 through the flexible board 13. The signals are processed by the drivers 12 in the non-display area NAA and sent to the display area AA. Two gate circuits are disposed in the non-display area NAA of the array substrate 21 with the display area AA therebetween in the X axis direction. The gate circuits 14 apply scanning signals to gate lines 24, which will be described later. Furthermore, a capacitor leading line 15 surrounding the display area AA is disposed in the non-display area NAA of the array substrate 21. The capacitor leading line 15 has a frame-shaped portion surrounding the display area AA and a leading portion extending from the frame-shaped portion. The capacitor leading line 15 is connected to the flexible board 13 at the leading portion to receive a reference potential from the flexible board 13.

Figure 2:
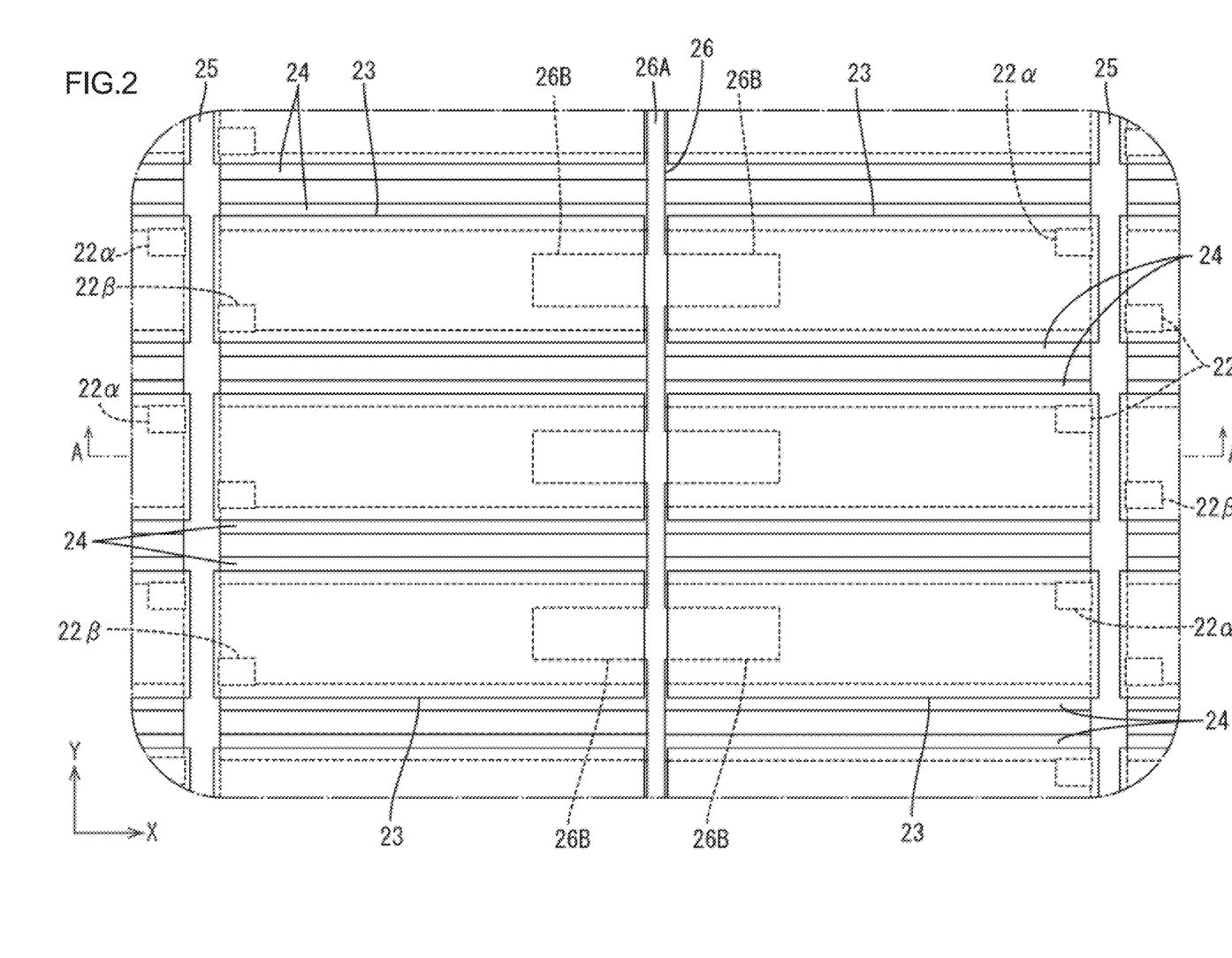
FIG. 2 is a plan view indicating an arrangement of pixels on an array substrate included in the liquid crystal panel.

FIG. 2 is a plan view illustrating an arrangement of the pixels in the display area AA of the array substrate 21 included in the liquid crystal panel 11. As illustrated in FIG. 2, the array substrate 21 included in the liquid crystal panel 11 has TFTs (thin film transistors, switching elements) and pixel electrodes 23 on the inner surface over the display area AA. The TFTs 22 and the pixel electrodes 23 are arranged in matrixes (columns and rows) with a space therebetween in the X axis direction (first direction) and the Y axis direction (second direction). The TFTs 22 and the pixel electrodes 23 are surrounded by gate lines (scanning lines) 24 and source lines (image lines, signal lines) 25 arranged in a grid-like pattern. The TFT 22 includes a gate electrode connected to the gate line 24, a source region connected to the source line 25, a drain region connected to the pixel electrode 23, and a channel region sandwiched between the source region and the drain region and formed of a semiconductor. When driven in response to the scanning signal from the gate line 24, the TFT 22 supplies an image signal (data signal) to the pixel electrode 23 through the source line 25, and thus the pixel electrode 23 is charged to a potential corresponding to the image signal. The pixel electrode 23 faces a counter electrode 16 (see FIG. 3) having a constant reference potential and disposed on the CF substrate 20 with a liquid crystal layer therebetween. Thus, an electrical field corresponding to a potential of the pixel electrode 23 is applied to the liquid crystal layer, allowing control of alignment state of the liquid crystal molecules contained in the liquid crystal layer. The liquid crystal panel 11 in this embodiment operates in a vertical alignment (VA) mode. The semiconductor material of the channel region of the TFT 22 is preferably an oxide semiconductor.

As illustrated in FIG. 2, the gate lines 24 extend in the X axis direction, and the source lines 25 extend in the Y axis direction. The gate line 24 and the source line 25 extend perpendicular to each other. The gate lines 24 are disposed in pairs between the pixel electrodes 23 adjacent to each other in the Y axis direction. The number of gate lines 24 is about twice the number of pixel electrodes 23 arranged in the Y axis direction. The source lines 25 are disposed in pairs with two of the pixel electrodes 23 therebetween in the X axis direction. In other words, the source lines 25 are disposed in every other space between the pixel electrodes 23 adjacent to each other in the X axis direction. The number of source lines 25 is about half the number of pixel electrodes 23 arranged in the X axis direction.

As illustrated in FIG. 2, the TFTs 22 include TFTs (first TFTs 22α) each connected to one of two gate lines (lower gate line in FIG. 2) located between the pixel electrodes 23 adjacent to each other in the Y axis direction and to the pixel electrode 23 adjacent to the lower gate line 24 and TFTs 22 (second TFTs 22β) each connected to the other of the two gate lines 24 (upper gate line in FIG. 2) and to the pixel electrode 23 adjacent to the upper gate line. The former TFTs 22 are referred to as first TFTs (first switching elements) 22α connected to the pixel electrodes 23 located at the even-numbered positions from the end in the X axis direction. The latter TFTs 22 are referred to as second TFTs (second switching elements) 22β connected to the pixel electrodes 23 located at the odd-numbered positions from the end in the X axis direction. In the following description, when the TFTs need to be distinguished from each other, a suffix "α" is added to the reference numeral of the "first TFT" and a suffix "β" is added to the reference numeral of the "second TFT", and when the TFTs do not need to be distinguished from each other, the suffixes are not added.

Figure 3:
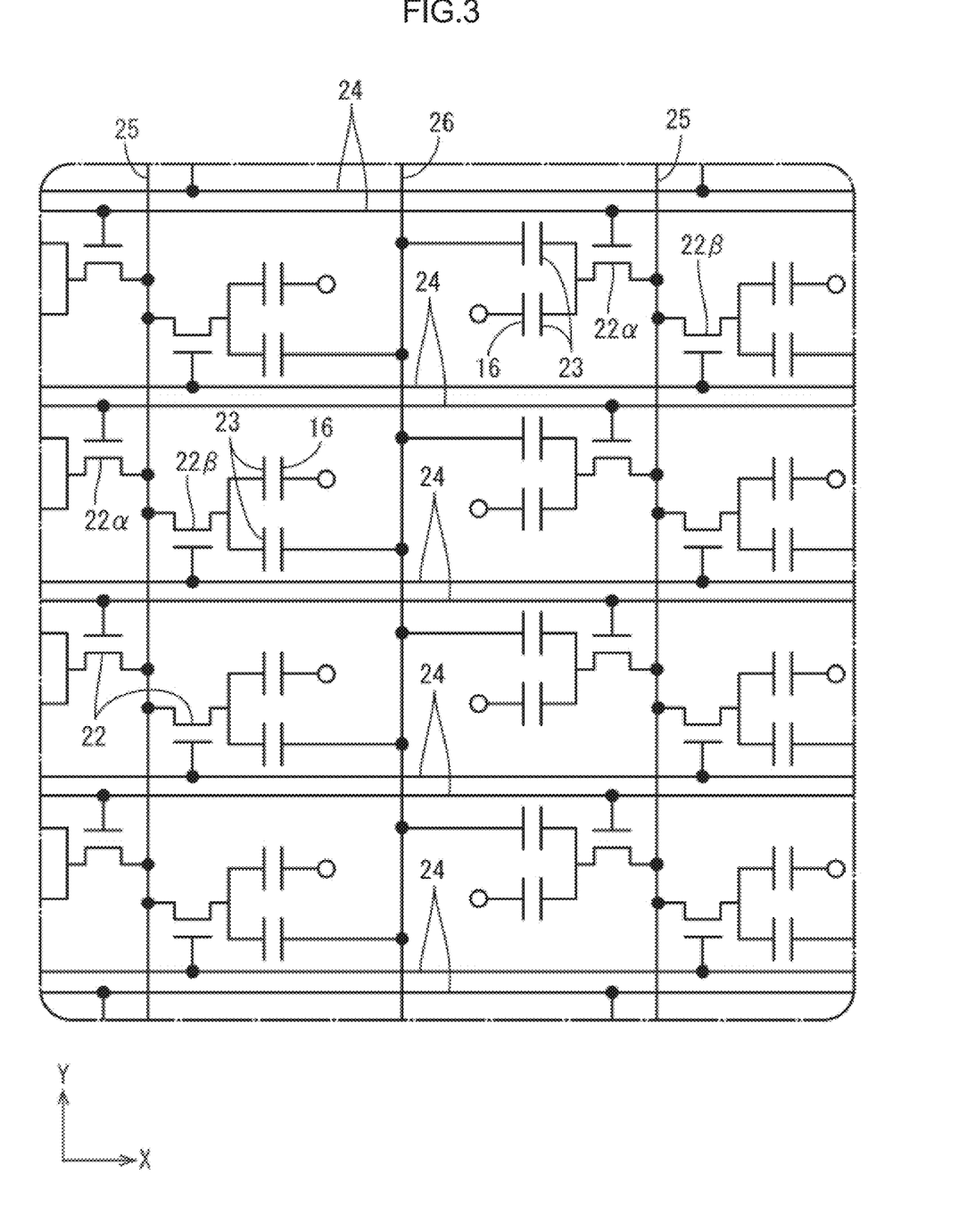
FIG. 3 is a circuit diagram indicating an electrical configuration of the liquid crystal panel.

FIG. 3 is a circuit diagram indicating an electrical configuration of the liquid crystal panel 11. As illustrated in FIGS. 2 and 3, some of the first TFTs 22α and some of the second TFTs 22β are connected to the same source line 25. Two pixel electrodes 23 positioned between two source lines 25 in the X axis direction receive image signals from the different source lines 25 through the first TFT 22α and the second TFT 22β. In contrast, two pixel electrodes 23 having the source line 25 therebetween in the X axis direction receive image signals from the same source line 25 through the first TFT 22α and the second TFT 22β. Of the two pixel electrodes 23 having the source line 25 therebetween in the X axis direction, one connected to the first TFT 22α is adjacent to one side of the source line 25 in the X axis direction (for example, the left side in FIG. 2) and the other connected to the second TFT 22β is adjacent to the other side of the source line 25 in the X axis direction (for example, the right side in FIG. 2).

Figure 4:
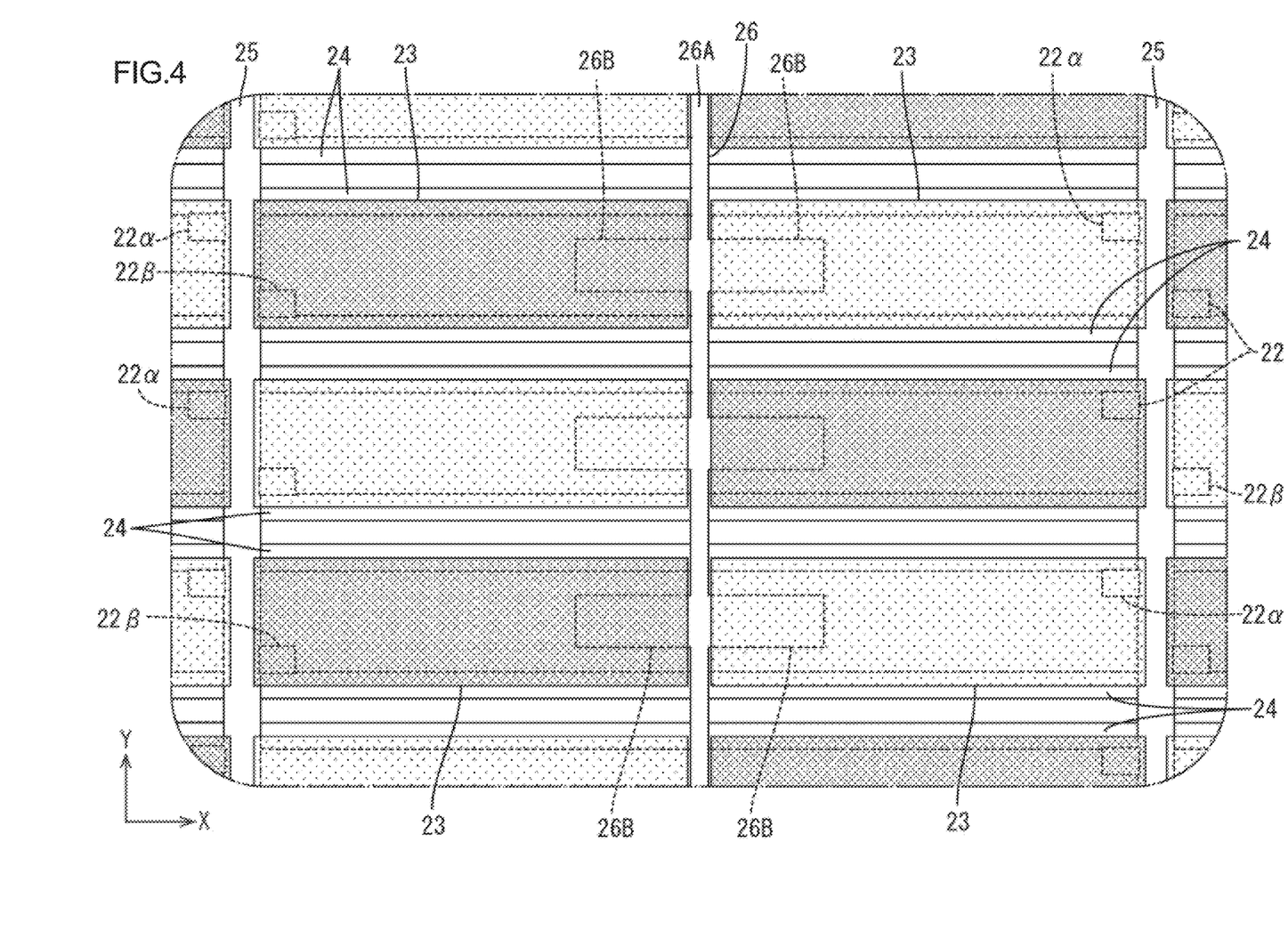
FIG. 4 is a plan view for explaining the charging timing of the pixel electrodes on the array substrate.

As illustrated in FIGS. 2 and 3, the first TFTs 22α and the second TFTs 22β connected to the same source line 25 are connected to the corresponding first and second gate lines 24 having the pixel electrodes 23 therebetween in the Y axis direction. The first TFTs 22α and the second TFTs 22β are arranged in a zig zag pattern (staggered arrangement) in a plan view such that the first TFTs 22α are diagonally opposed to the second TFTs 22β. In this configuration, image signals supplied to the same source line 25 are sent to the two pixel electrodes 23 having the source line 25 therebetween in the X axis direction through the first TFTs 22α and the second TFTs 22β connected to different gate lines 24. Thus, the two gate lines 24 having the two pixel electrodes 23 therebetween in the Y axis direction receive scanning signals at different timings, allowing the two pixel electrodes 23 to be charged to different potentials. At this time, as illustrated in FIG. 4, among the pixel electrodes 23 arranged in a row in the X axis direction, the even-numbered pixel electrodes 23 connected to the first TFTs 22α and the even-numbered pixel electrodes 23 connected to the second TFTs 22β are charged at different timings. FIG. 4 is a plan view for explaining the charging timing of the pixel electrodes 23. In FIG. 4, the pixel electrodes 23 that are charged at the same time are shaded in the same way, and the pixel electrodes 23 that are charged at different timings are differently shaded. This configuration reduces the number of source lines 25 compared with a configuration in which the source lines and the pixel electrodes are alternately arranged in the X axis direction and the gate lines and the pixel electrodes are alternately arranged in the Y axis direction. Thus, the number or the size of the circuits for driving the source lines 25 is reduced. The above-described configuration advantageously downsizes the frame, reduces the cost, and improves the definition of the liquid crystal panel 11. In this configuration, the pixel electrodes 23 arranged in a row are charged at two different timings, and thus the charging time for each of the pixel electrodes 23 tends to be short. However, the pixel electrodes 23 are sufficiently charged in the short charging time because the semiconductor material of the channel region of the TFT 22 is an oxide semiconductor, which has electron mobility higher than that of amorphous silicon, for example.

In this configuration, the pixel electrodes 23 adjacent to each other in the X axis direction are charged at different timings, and thus parasitic capacitance may be generated between the pixel electrodes 23. As a measure against the parasitic capacitance, as illustrated in FIG. 2, the pixel electrodes 23 in this embodiment each have a rectangular shape in a plan view or an elongated shape in which the longitudinal direction (long-side direction) extends in the X axis direction and the transverse direction (short-side direction) extends in the Y axis direction. In this configuration, the long sides of the pixel electrodes 23 adjacent to each other in the X axis direction do not face each other and the short sides thereof face each other. Thus, the pixel electrodes 23 adjacent to each other in the X axis direction generate less parasitic capacitance than those in conventional configurations when charged at different timings. Thus, the potential of the charged pixel electrode 23 is unlikely to fluctuate. Furthermore, in the pixel electrode 23, the ratio of the length of the short side to the length of the long side is 1 to 3.

Figure 5:
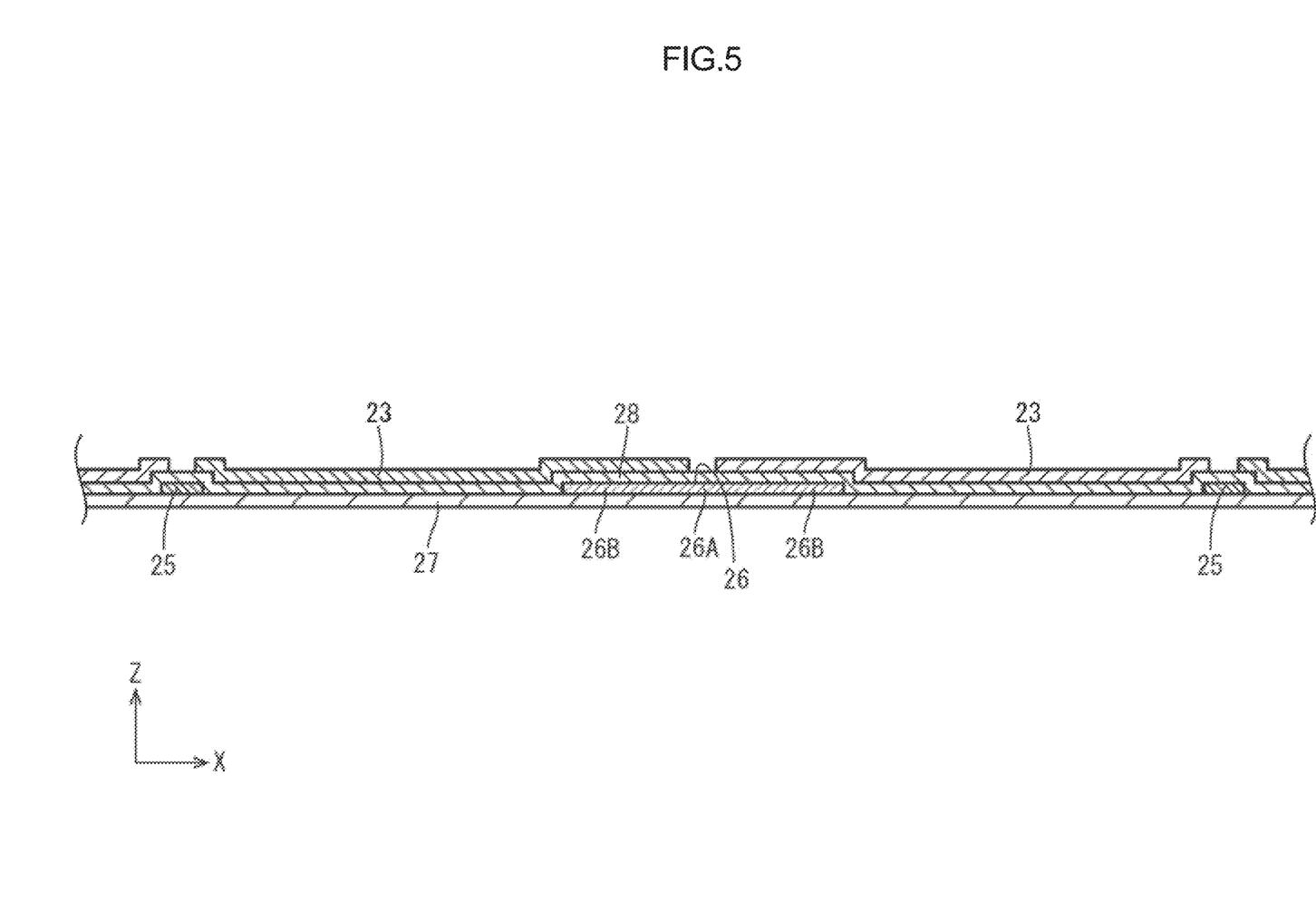
FIG. 5 is a cross-sectional view of the array substrate taken along line A-A in FIG. 2.

FIG. 5 is a cross-sectional view of the array substrate 21 taken at the middle of the pixel electrodes 23 in the Y axis direction. As illustrated in FIGS. 2 and 5, in this embodiment, a capacitor line 26 partly overlapping the pixel electrodes 23 is disposed in the display area AA of the array substrate 21. The capacitor line 26 extends in the Y axis direction in the display area AA and is parallel with the source lines 25 and perpendicular to (intersect with) the gate lines 24. The capacitor line 26 is connected to the capacitor leading line 15 in the non-display area NAA to receive a reference potential. The capacitor line 26 is formed of the same metal film as the source lines 25. The capacitor line 26 is positioned above the gate lines 24 with a lower insulating film 27 therebetween and is positioned below the pixel electrodes 23 with an upper insulating film 28 therebetween. Thus, the capacitance is generated between the capacitor line 26 and the pixel electrode 23 overlapping the capacitor line 26 with the upper insulating film 28 therebetween, allowing the charged pixel electrode 23 to have a constant potential. The capacitor line 26 is positioned such that the pixel electrodes 23 are located between the capacitor line 26 and the source lines 25 in the X axis direction. The capacitor line 26 is positioned between the two pixel electrodes 23 that are positioned between the two source lines 25. In other words, the capacitor line 26 is positioned between the two pixel electrodes 23 located between the two source lines 25. This configuration advantageously increases the aperture ratio compared with a configuration in which a capacitor line extends across the pixel electrode 23 through the middle in the X axis direction. The capacitor line 26 includes a capacitor line body 26A extending in the Y axis direction and capacitance formation portions 26B branching and protruding from the capacitor line body 26A in the Y axis direction. The capacitor line body 26A has a width equal to or smaller than the distance between the pixel electrodes 23 adjacent to the capacitor line body 26A in the X axis direction and does not overlap the pixel electrodes 23. The capacitor line 26 includes pairs of the capacitance formation portions 26B protruding from the capacitor line body 26A in the X axis direction to the left and the right in FIG. 2. The capacitance formation portion 26B entirely or mostly overlaps the pixel electrode 23. Thus, the capacitance generated between the capacitor line 26 and the pixel electrode 23 is controlled by adjusting the area (the protruding length from the capacitor line body 26A or the width) of the capacitance formation portion 26B. The capacitor line 26, which is positioned between the pixel electrodes 23 adjacent to each other in the X axis direction, blocks an electric field that generates parasitic capacitance between the pixel electrodes 23 due to the charging of the pixel electrodes 23 at different timings and advantageously reduces parasitic capacitance. The parasitic capacitance is sufficiently reduced in this embodiment in which the pixel electrodes 23 adjacent to each other in the X axis direction have short sides facing each other. This allows an electric field that generates parasitic capacitance to be sufficiently blocked even if the area of the capacitor line 26 overlapping the pixel electrodes 23 is small. Thus, the aperture ratio is increased.

Figure 6:
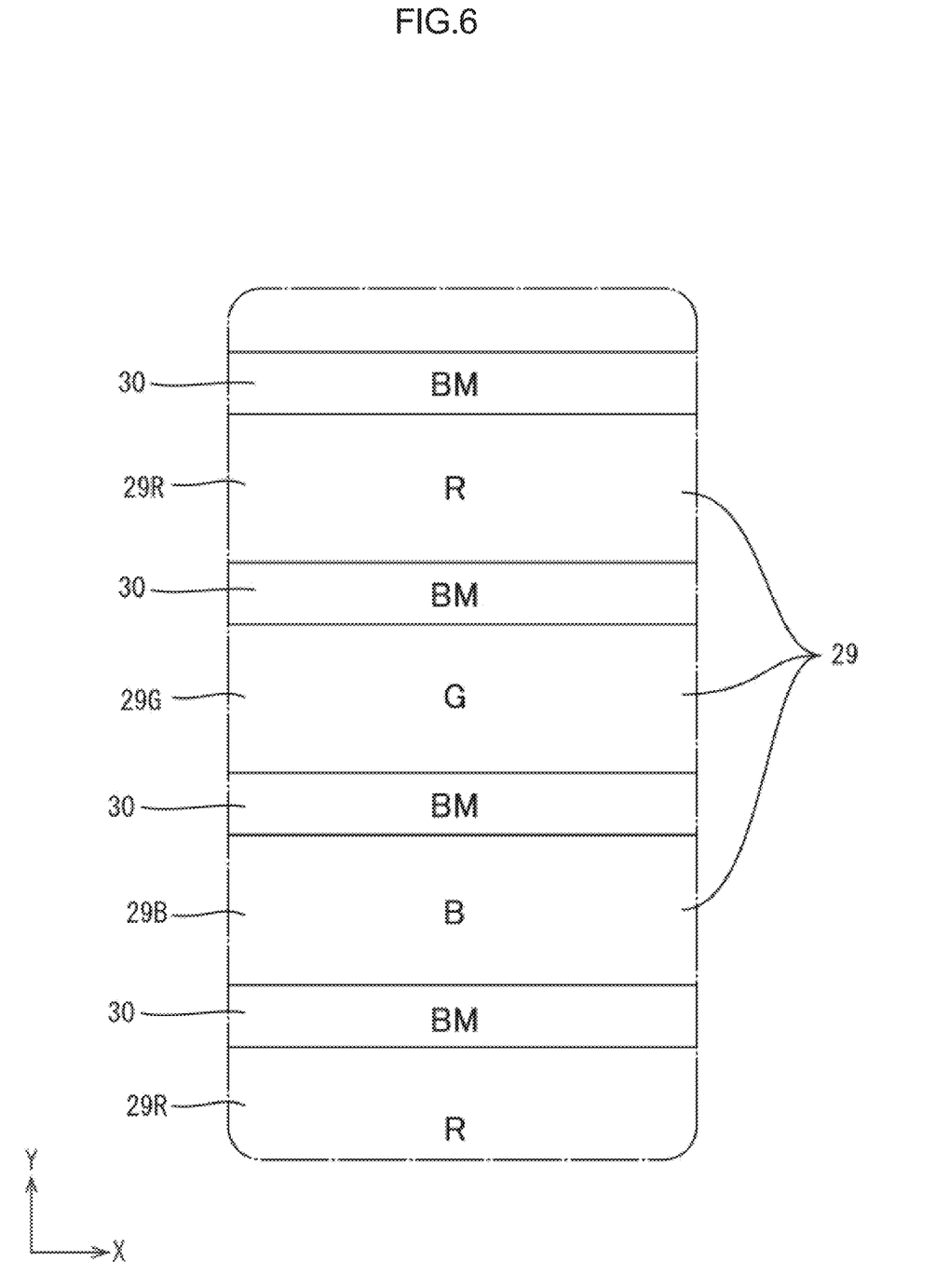
FIG. 6 is a plan view indicating an arrangement of color filters on the CF substrate included in the liquid crystal panel.

FIG. 6 is a plan view indicating an arrangement of color filters 29 in the display area AA of the CF substrate 20. As indicated in FIG. 6, the color filters 29 opposed to the pixel electrodes 23 on the array substrate 21 are disposed on the CF substrate 20 over the display area AA. The color filters 29 each extend in the X axis direction and have a horizontally long band-like overall shape. The color filters 29 include a red color filter 29R that has a red color and selectively transmits red light in a wavelength range of red (about 600 nm to about 780 nm), a blue color filter 29B that has a blue color and selectively transmits blue light in a wavelength range of blue (about 420 nm to about 500 nm), and a green color filter 29G that has a green color and selectively transmits green light in a wavelength range of green (about 500 nm to about 570 nm). The red color filters 29R, the green color filters 29G, and the blue color filters 29B, which are included in the color filters 29, are repeatedly arranged in the Y axis direction, and the red, green, and blue color filters 29R, 29G, and 29B adjacent to each other in the Y axis direction have different colors. The color filters 29 form pixels together with the opposing pixel electrodes 23. The pixels are arranged in the X axis direction and the Y axis direction in columns and rows on the surface of the liquid crystal panel 11 and have colors corresponding to the colors of the color filters 29R, 29G, and 29B. The amount of light passing through each of the red, green, and blue pixels arranged in the Y axis direction is controlled based on the potential of the pixel 23, and thus color display in a predetermined tone is provided. Among the pixels arranged in columns and rows, the pixels adjacent to each other in the Y axis direction have different colors and the pixels adjacent to each other in the X axis direction have the same color. Some potential fluctuation may occur in the pixel electrode 23 due to the parasitic capacitance generated between the pixel electrodes adjacent to each other in the X axis direction. In such a case, the color unevenness caused by the potential fluctuation is less noticeable. Furthermore, the light-blocking portions 30 are disposed between the adjacent color filters 29 on the CF substrate 20. The light-blocking portions 30 each have a band-like shape extending in the X axis direction as the color filters 29 and does not allow light to travel between the pixels (color filters 29) having different colors, and thus prevents color mixture. Furthermore, the CF substrate 20 has a counter electrode 16 (see FIG. 3) disposed in a solid pattern in the display area AA.

As described above, the array substrate (substrate for a display device) 21 of this embodiment includes the source lines (image lines) 25 arranged at intervals in the first direction, the gate lines (scanning lines) 24 arranged at intervals in the second direction intersecting the first direction, the pixel electrodes 23 arranged at intervals in the first direction and the second direction in rows and columns and each having an elongated shape in which the longitudinal direction extends in the first direction, the first TFT (first switching element) 22α connected to one of two gate lines 24 having the pixel electrodes 23 therebetween, one of the pixel electrodes 23 that is located at an even-numbered position from an end in the first direction, and one of the source lines 25 adjacent to the even-numbered pixel electrode 23, and the second TFT (second switching element) 22β connected to the other of the gate lines 24 having the pixel electrodes 23 therebetween, one of the pixel electrodes 23 that is located at an odd-numbered position from the end in the first direction, and one of the source lines 25 adjacent to the odd-numbered pixel electrode 23.

In this configuration, when one of the two gate lines 24 having the pixel electrodes 23 therebetween receives a signal, the first TFTs 22α are driven. At this time, the even-numbered pixel electrodes 23 are charged in response to the signal supplied to the source line 25 adjacent to the pixel electrodes 23 that are located at the even-numbered positions from the end in the first direction. In contrast, when the other of the two gate lines 24 having the pixel electrodes 23 therebetween receives a signal, the second TFTs 22β are driven. At this time, the odd-numbered pixel electrodes 23 are charged in response to the signal supplied to the source line 25 adjacent to the pixel electrodes 23 that located at the odd-numbered positions from the end in the first direction. In this configuration, the pixel electrodes 23 adjacent to each other in the first direction are charged at different timings, and thus parasitic capacitance may be generated between the adjacent pixel electrodes 23. To overcome this problem, the pixel electrodes each have an elongated shape in which the longitudinal direction extends in the first direction. The long sides of the pixel electrodes 23 adjacent to each other in the first direction do not face each other but the short sides thereof face each other. In this configuration, less parasitic capacitance is generated between the pixel electrodes 23 adjacent to each other in the first direction than in a conventional technology, and thus the potential of the charged pixel electrodes 23 is unlikely to fluctuate.

The gate lines 24 are disposed in pairs between the pixel electrodes 23 adjacent to each other in the second direction, and the pairs of the gate lines 24 each include one connected to the first TFTs 22α and one connected to the second TFTs 22β. The source lines 25 are disposed in pairs with the two pixel electrodes 23 adjacent to each other in the first direction therebetween, and the source lines 25 are each connected to both the first TFTs 22α and the second TFTs 22β. In this configuration, sequential supplying of signals to the two gate lines 24 located between the pixel electrodes adjacent to each other in the second direction sequentially drive the first TFTs 22α connected to one of the gate lines 24 and the second TFTs 22β connected to the other. When signals are supplied to the two source lines 25 having the two pixel electrodes 23 adjacent to each other in the first direction therebetween in synchronization with the driving of the second TFTs 22β, the pixel electrodes 23 connected to the source lines 25 are charged through the second TFTs 22β in response to the signals. This configuration reduces the number of source lines 25 and advantageously improves the definition compared with a configuration in which the gate lines and the pixel electrodes are alternately arranged in the second direction and the source lines and the pixel electrodes are alternately arranged in the first direction.

Furthermore, the array substrate 21 includes the capacitor line 26 disposed such that the pixel electrodes 23 are located between the capacitor line 26 and the source lines 25 in the first direction. The capacitor line 26 partly overlaps the pixel electrodes 23. In this configuration, capacitance is generated between the pixel electrodes 23 and the capacitor line 26, because the capacitor line 26 partly overlaps the pixel electrodes 23 with an insulating film therebetween, allowing the pixel electrode 23 to have a constant potential. The capacitor line 26 is located such that the pixel electrodes 23 are positioned between the capacitor line 26 and the source lines 25 in the first direction, and the capacitor line 26 is positioned between the two pixel electrodes 23 located between the two source lines 25. In other words, the capacitor line 26 is positioned between the two pixel electrodes 23 located between the two source lines 25. This configuration advantageously increases the aperture ratio compared with a configuration in which a capacitor line extends across the pixel electrodes 23. Furthermore, the capacitor line 26 positioned between the pixel electrodes 23 that are adjacent to each other in the first direction blocks an electric field between the pixel electrodes 23, which may generate parasitic capacitance, and advantageously reduces parasitic capacitance. In particular, the parasitic capacitance, which may be generated between the pixel electrodes 23 that are adjacent to each other in the first direction, is sufficiently reduced by the configuration in which the pixel electrodes 23 adjacent to each other in the first direction have short sides facing each other. Thus, the electric field generating the parasitic capacitance is sufficiently blocked even if the area of the capacitor line 26 overlapping the pixel electrode 23 is small. The aperture ratio is further advantageously increased.

Furthermore, the liquid crystal display device (display device) 10 of this embodiment includes the above-described array substrate 21 and the CF substrate (counter substrate) 20 opposed to the array substrate 21. In the liquid crystal display device 10, the potential of the charged pixel electrode 23 of the array substrate 21 is unlikely to fluctuate, and the display tone is unlikely to be deviated by the potential fluctuation of the pixel electrode 23. Thus, display quality is improved.

Furthermore, the CF substrate 20 includes the color filters 29 opposed to the pixel electrodes 23 and arranged in the second direction. The color filters 29 adjacent to each other in the second direction have different colors. In this configuration, the light passing through the color filter 29 is colored red, green, or blue corresponding to the color of the color filter 29. The color filters 29 that are arranged in the second direction have different colors, and thus the color display is provided by controlling the amount of light released through the color filters 29 based on the potentials of the pixel electrodes 23 opposed to the red, green, and blue color filters 29. The color filters 29 opposed to the pixel electrodes 23 that are arranged in the first direction have the same color. Some potential fluctuation may occur in the pixel electrodes 23 based on the parasitic capacitance generated between the pixel electrodes 23 adjacent to each other in the first direction. In such a case, the color unevenness caused by the potential fluctuation is less noticeable.

Second Embodiment

A second embodiment of the invention is described with reference to FIG. 7. In the second embodiment, the capacitor line 126 has a different configuration. The structures, the operations, and the effects similar to those in the first embodiment are not described.

Figure 7:
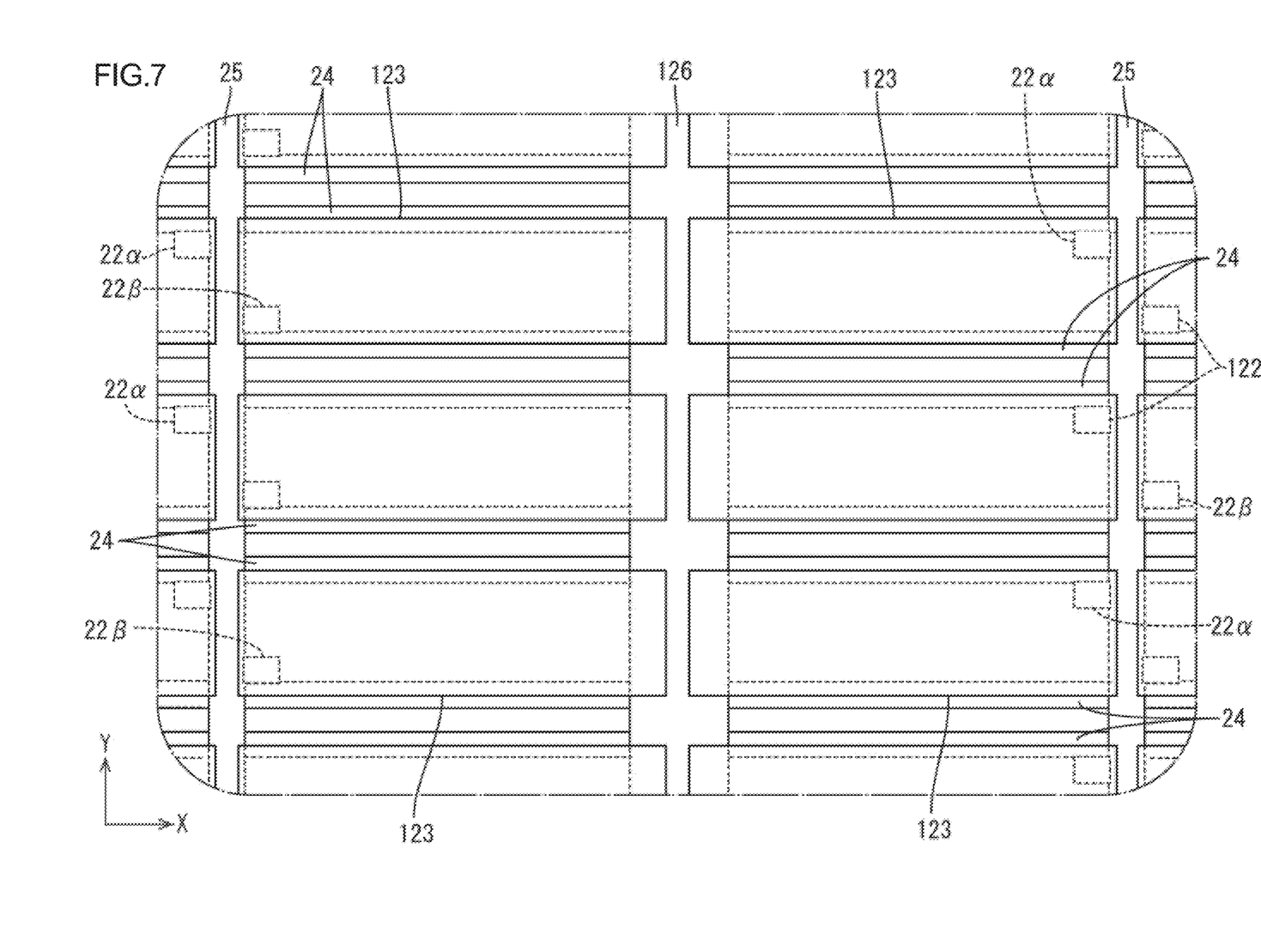
FIG. 7 is a plan view indicating an arrangement of pixels on an array substrate included in a liquid crystal panel according to a second embodiment of the invention.

As illustrated in FIG. 7, the capacitor line 126 in this embodiment extends in the Y axis direction and has a substantially constant width. The capacitor line 126 does not have the capacitance formation portions described in the first embodiment. The capacitor line 126 has a width larger than the distance between the pixel electrodes 123 adjacent to each other in the X axis direction. Thus, the side-end portions of the capacitor line 126 overlap the end portions away from the TFTs 122 of the pixel electrodes 123 adjacent to the capacitor line 126. In the capacitor line 126 having such a configuration, the capacitor line 126 located between the pixel electrodes 123 reliably blocks the electric field that generates parasitic capacitance between the pixel electrodes 123 when the pixel electrodes 123 adjacent to each other in the X axis direction are charged at different timings, and thus the parasitic capacitance is reduced. In this embodiment, the parasitic capacitance is also sufficiently reduced by the configuration in which the short sides of the pixel electrodes 123 that are adjacent to each other in the X axis direction face each other. Thus, the electric field generating parasitic capacitance is sufficiently blocked even if the area of the capacitor line 126 overlapping the pixel electrodes 123 is small. More specifically described, in the pixel electrode 123, the ratio of the length of the short side to the length of the long side is 1 to 3. In this configuration, compared with a configuration in which the long sides of the pixel electrodes adjacent to each other in the X axis direction face each other, the parasitic capacitance is reduced to about one-third and the length of the capacitor line 126 extending across the pixel electrode 123 is reduced to about one-third. Thus, the overlapping area between the pixel electrode 123 and the capacitor line 126 required for blocking the electric field is about one-ninth the overlapping area in a configuration in which the long sides of the pixel electrodes adjacent to each other in the X axis direction face each other. Thus, the aperture ratio is increased.

Third Embodiment

A third embodiment of the invention is described with reference to FIG. 8 or 9. In the third embodiment, the gate lines 224 and the source lines 225 are arranged differently from those in the first embodiment. The structures, operations, and effects similar to those in the first embodiment are not described.

Figure 8:
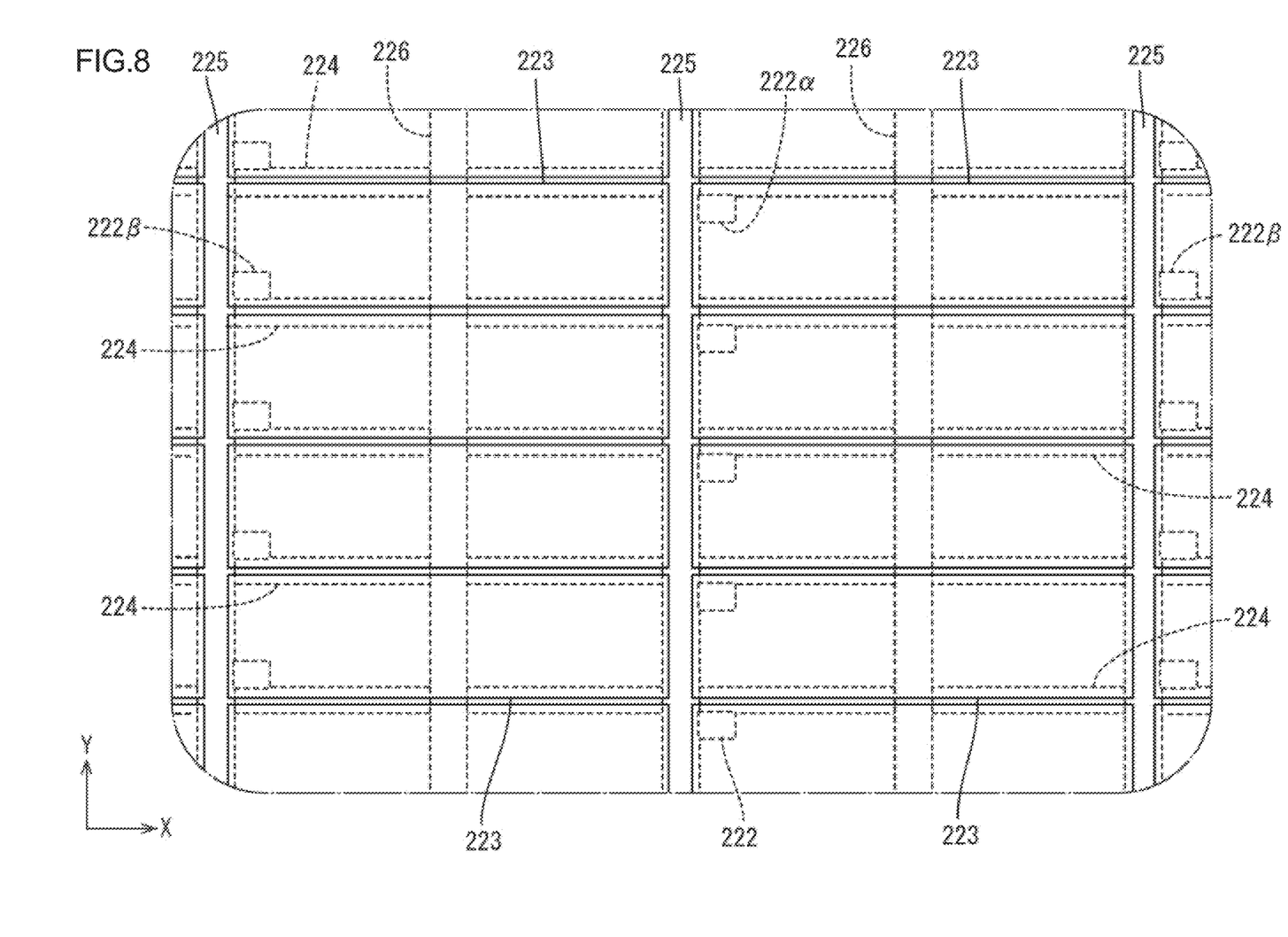
FIG. 8 is a plan view indicating an arrangement of pixels on an array substrate included in a liquid crystal panel according to a third embodiment of the invention.
Figure 9:
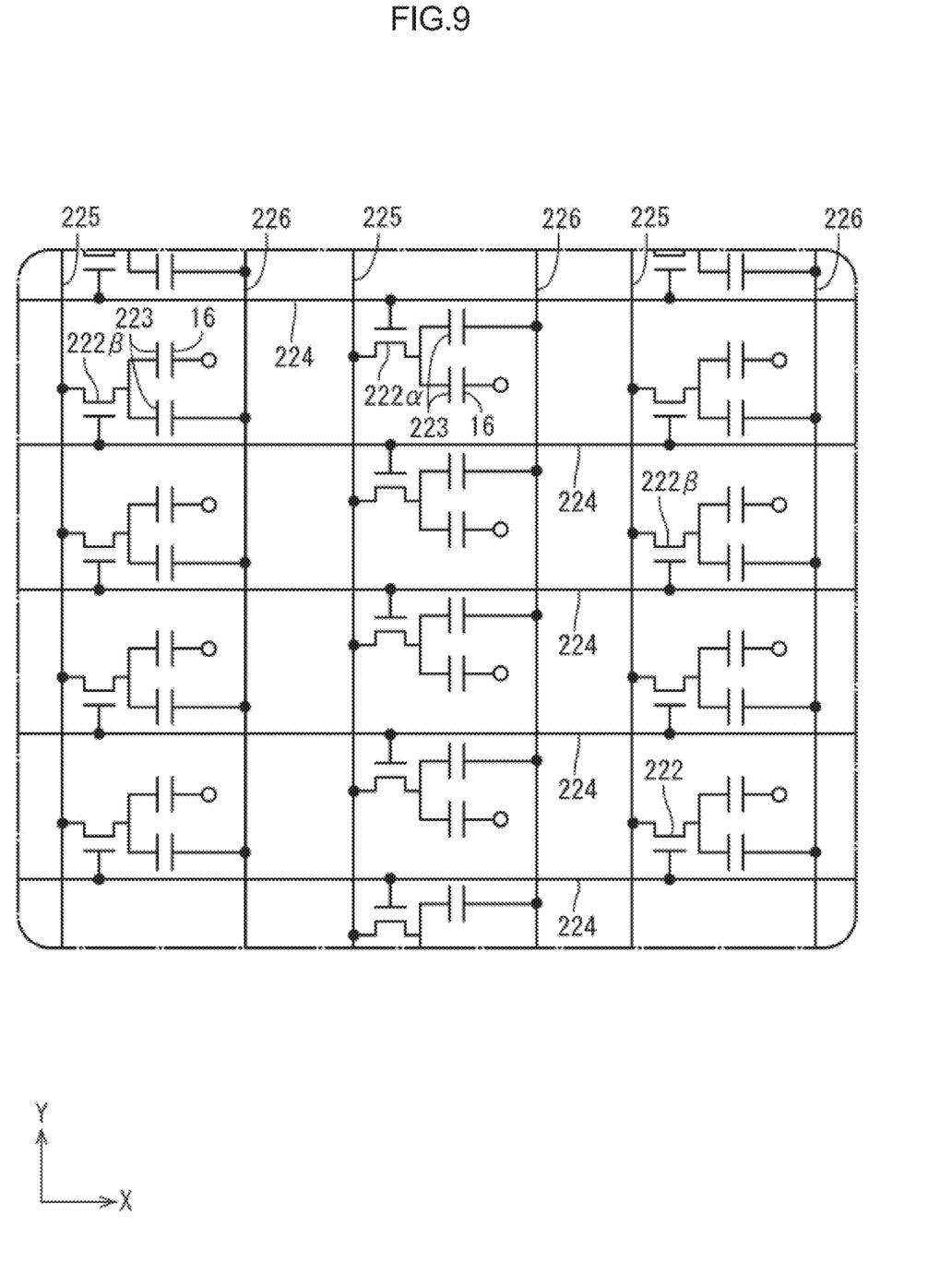
FIG. 9 is a circuit diagram indicating an electrical configuration of the liquid crystal panel.

As illustrated in FIGS. 8 and 9, in this embodiment, the gate lines 224 and the pixel electrodes 223 are alternately arranged in the Y axis direction. Thus, the number of the gate lines 224 is substantially the same as the number of the pixel electrode 223 that are arranged in the Y axis direction. The source lines 225 and the pixel electrodes 223 are alternately arranged in the X axis direction. Thus, the number of source lines 225 is substantially the same as that of the pixel electrodes 223 that are arranged in the X axis direction. The TFTs 222 include first TFTs 222α connected to the pixel electrodes 223 that are located at the even-numbered positions from the end in the X axis direction and second TFTs 22213 connected to the pixel electrodes 223 that are located at the odd-numbered positions from the end in the X axis direction. In this configuration, the pixel electrodes 223 that are adjacent to each other in the X axis direction are charged at different timings by the first TFT 222α and the second TFT 22213 connected to different gate lines 224. Thus, parasitic capacitance may be generated between the pixel electrodes 223. As a measure against the parasitic capacitance, in this embodiment, the pixel electrodes 223 adjacent to each other in the X axis direction have short sides facing each other to reduce the parasitic capacitance. Furthermore, the capacitor line 226 extends in the Y axis direction across the pixel electrode 223 through the middle and overlaps the middle of the pixel electrode 223.

Other Embodiments

The technology described herein is not limited to the embodiments described above and illustrated by the drawings. For example, the following embodiments are included in the technical scope of the technology described herein.

(1) In the above-described embodiments, the pixel electrodes have a rectangular shape in a plan view. However, the pixel electrodes may have any elongated shape in a plan view. Examples of the shape of the pixel electrode in a plan view include a parallelogram, a rhomboid, a shape consisting of multiple parallelograms, and a shape consisting of multiple rhomboids. The pixel electrode may have a rectangular shape with a rounded corner or a diagonally trimmed-off corner.

(2) In the above-described embodiments, the long sides of the pixel electrodes extend in the X axis direction and the short sides thereof extend in the Y axis direction. However, the long sides of the pixel electrodes may be inclined to the X axis direction and the short sides thereof may be inclined to the Y axis direction. In such a case, "the long sides (longitudinal direction) of the pixel electrode extend in the X axis direction and the short sides (transverse direction) thereof extend in the Y axis direction" is satisfied if the inclination angle of the long sides of the pixel electrode relative to the X axis direction and the inclination angle of the short sides thereof relative to the Y axis direction are each not greater than 45 degrees.

(3) In the above-described embodiments, the gate lines extend in the X axis direction, and the source lines and the capacitor line extend in the Y axis direction. However, at least one of the gate lines, source lines, and the capacitor line may meander in a zig zag pattern and may include at least a portion extending obliquely relative to the X axis direction or the Y axis direction.

(4) In the above-described embodiments, the capacitor line extending parallel to the source lines is formed of the same metal film as the source lines. However, the capacitor line extending parallel to the source lines may be formed of a metal film different from the metal film forming the source lines. In such a case, the metal film forming the capacitor line may be disposed below the metal film forming the gate lines with an insulating film therebetween or may be disposed above the metal film forming the source lines with an insulating film therebetween.

(5) In the above-described embodiments, the capacitor line extends parallel to the source lines. However, the capacitor line may extend parallel to the gate lines. In such a case, the capacitor line is preferably formed of the same metal film as the gate lines but may be formed of a different metal film.

(6) In the above-described embodiments, the ratio of the length of the short side to the length of the long side in the pixel electrode is 1 to 3. However, the ratio of the length of the short side to the length of the long side in the pixel electrode is not limited to 1 to 3.

(7) In the above-described embodiments, the number of colors of the color filters is three. However, the number of colors of the color filters may be smaller or larger than three. In such a case, the ratio of the length of the short side to the length of the long side in the pixel electrode is preferably accordingly changed. The ratio preferably corresponds to the number of colors of the color filters but may be different from the number of colors of the color filters.

(8) In the above-described embodiments, the ratio of the length of the short side to the length of the long side in the pixel electrode corresponds to the number of colors of the color filters. However, the ratio may be different from the number of colors of the color filters.

(9) In the above-described embodiments, the liquid crystal panel operates in a VA mode. However, the liquid crystal panel may operate in a TN mode, an FFS mode, or an IPS mode.

(10) In the above-described embodiments, four drivers are mounted on the array substrate. However, the number of drivers on the array substrate may be suitably changed.

(11) In the above-described embodiments, the gate circuits are disposed on the array substrate. However, the gate circuits may be eliminated. A gate driver having a similar function as the gate circuit may be disposed on the array substrate. The gate circuit may be disposed on only one end of the array substrate.

(12) In the above-described embodiments, the semiconductor film forming the channel region of the TFT is formed of an oxide semiconductor. However, the semiconductor material may be amorphous silicon or polycrystalline silicon (LTPS).

(13) In the above-described embodiments, the liquid crystal panel is a transmissive liquid crystal panel. However, the technology described herein is applicable to a reflective liquid crystal panel and a semi-transmissive liquid crystal panel.

(14) In the above embodiments, the liquid crystal display device (the liquid crystal panel and the backlight device) has a horizontally long rectangular shape in a plan view. However, the shape of the liquid crystal display device in a plan view may be a vertically long rectangle, a square, a circle, a semi-circle, an oval, an ellipse, or a trapezoid, for example.

The invention claimed is:

1. A substrate for a display device, the substrate comprising:
   image lines arranged at intervals in a first direction, the image lines including a first image line and a second image line;
   scanning lines arranged at intervals in a second direction intersecting the first direction, the scanning lines including a first scanning line and a second scanning line;
   pixel electrodes arranged at intervals in the first direction and the second direction in rows and columns and each having an elongated shape extending in the first direction, the pixel electrodes including a first pixel electrode and a second pixel electrode that are arranged adjacent to each other in the first direction and between the first scanning line and the second scanning line, the first pixel electrode being adjacent to the first image line and the second pixel electrode being adjacent to the second image line;
   switching elements connected to the pixel electrodes, the image lines, and the scanning lines, the switching elements including:
      a first switching element connected to the first scanning line, the first pixel electrode, and the first image line; and
      a second switching element connected to the second scanning line, the second pixel electrode, and the second image line, wherein
   the first pixel electrode and the second pixel electrode are provided between the first image line and the second image line,
   the pixel electrodes further include a third pixel electrode that is adjacent to the second pixel electrode and provided on an opposite side from the second pixel electrode with respect to the second image line, and
   the switching elements further include a third switching element connected to the first scanning line, the third pixel electrode, and the second image line.

2. A substrate for a display device, the substrate comprising:
   image lines arranged at intervals in a first direction, the image lines including a first image line and a second image line;
   scanning lines arranged at intervals in a second direction intersecting the first direction, the scanning lines including a first scanning line and a second scanning line;
   pixel electrodes arranged at intervals in the first direction and the second direction in rows and columns and each having an elongated shape extending in the first direction, the pixel electrodes including a first pixel electrode and a second pixel electrode that are arranged adjacent to each other in the first direction and between the first scanning line and the second scanning line, the first pixel electrode being adjacent to the first image line and the second pixel electrode being adjacent to the second image line;

switching elements connected to the pixel electrodes, the image lines, and the scanning lines, the switching elements including:

a first switching element connected to the first scanning line, the first pixel electrode, and the first image line; and a second switching element connected to the second scanning line, the second pixel electrode, and the second image line, wherein the first pixel electrode and the second pixel electrode are arranged along the first direction and included in a row of the pixel electrodes extending in the first direction.

3. The substrate for a display device according to claim 1, wherein:

the pixel electrodes further include a fourth pixel electrode that is adjacent to the first pixel electrode and disposed on an opposite side from the first pixel electrode with respect to the first image line, and the switching elements further include a fourth switching element connected to the second scanning line, the fourth pixel electrode, and the first image line.

4. The substrate for a display device according to claim 3, wherein:

the scanning lines further include a third scanning line disposed on an opposite side from the second scanning line with respect to the first scanning line, the pixel electrodes further include a fifth pixel electrode that is adjacent to the second pixel electrode and disposed on an opposite side from the second pixel electrode with respect to the first scanning line and the third scanning line, the first scanning line and the third scanning line are disposed between the second pixel electrode and the fifth pixel electrode that are adjacent to each other in the second direction, and the switching elements further include a fifth switching element connected to the third scanning line, the fifth pixel electrode, and the second image line.

5. The substrate for a display device according to claim 1, wherein:

the scanning lines further include a third scanning line disposed on an opposite side from the second scanning line with respect to the first scanning line, the pixel electrodes further include a fifth pixel electrode that is adjacent to and disposed on an opposite side from the second pixel electrode with respect to the first scanning line and the third scanning line, the first scanning line and the third scanning line are disposed between the second pixel electrode and the fifth pixel electrode that are adjacent to each other in the second direction, and the switching elements further include a fifth switching element connected to the third scanning line, the fifth pixel electrode, and the second image line.

6. The substrate for a display device according to claim 1, further comprising a capacitor line extending in the second direction and between the first image line and the second image line.

7. A display device comprising:

a substrate for a display device, the substrate including:

image lines arranged at intervals in a first direction, the image lines including a first image line and a second image line;

scanning lines arranged at intervals in a second direction intersecting the first direction, the scanning lines including a first scanning line and a second scanning line;

pixel electrodes arranged at intervals in the first direction and the second direction in rows and columns and each having an elongated shape extending in the first direction, the pixel electrodes including a first pixel electrode and a second pixel electrode that are between the first scanning line and the second scanning line, the first pixel electrode being adjacent to the first image line and the second pixel electrode being adjacent to the second image line;

switching elements connected to the pixel electrodes, the image lines, and the scanning lines, the switching elements including a first switching element connected to the first scanning line, the first pixel electrode, and the first image line and a second switching element connected to the second scanning line, the second pixel electrode, and the second image line; and a capacitor line extending in the second direction and between the first image line and the second image line, the capacitor line partly overlapping the pixel electrodes; and a counter substrate opposed to the substrate, wherein the first pixel electrode and the second pixel electrode are adjacent to each other in the first direction, the first pixel electrode and the second pixel electrode are disposed between the first image line and the second image line, the pixel electrodes further include a third pixel electrode that is adjacent to the second pixel electrode and disposed on an opposite side from the second pixel electrode with respect to the second image line, and the switching elements further include a third switching element connected to the first scanning line, the third pixel electrode, and the second image line.

8. The display device according to claim 7, wherein:

the pixel electrodes further include a fourth pixel electrode that is adjacent to the first pixel electrode and disposed on an opposite side from the first pixel electrode with respect to the first image line, and the switching elements further include a fourth switching element connected to the second scanning line, the fourth pixel electrode, and the first image line.

9. The display device according to claim 8, wherein:

the scanning lines further include a third scanning line disposed on an opposite side from the second scanning line with respect to the first scanning line, the pixel electrodes further include a fifth pixel electrode that is adjacent to the second pixel electrode and disposed on an opposite side from the second pixel electrode with respect to the first scanning line and the third scanning line, the first scanning line and the third scanning line are disposed between the second pixel electrode and the fifth pixel electrode that are adjacent to each other in the second direction, and the switching elements further include a fifth switching element connected to the third scanning line, the fifth pixel electrode, and the second image line.

10. The display device according to claim 7, wherein
the scanning lines further include a third scanning line disposed on an opposite side from the second scanning line with respect to the first scanning line,
the pixel electrodes further include a fifth pixel electrode that is adjacent to the second pixel electrode and disposed on an opposite side from the second pixel electrode with respect to the first scanning line and the third scanning line,
the first scanning line and the third scanning line are disposed between the second pixel electrode and the fifth pixel electrode that are adjacent to each other in the second direction, and
the switching elements further include a fifth switching element connected to the third scanning line, the fifth pixel electrode, and the second image line.

11. The substrate for a display device according to claim 2, further comprising a capacitor line extending in the second direction and between the first image line and the second image line.

* * * * *